United States Patent
Fromson et al.

[11] Patent Number: 5,967,048
[45] Date of Patent: Oct. 19, 1999

[54] METHOD AND APPARATUS FOR THE MULTIPLE IMAGING OF A CONTINUOUS WEB

[75] Inventors: Howard A. Fromson, 43 Main St., Stonington, Conn. 06378; William J. Rozell, Vernon, Conn.

[73] Assignee: Howard A. Fromson, Stonington, Conn.

[21] Appl. No.: 09/096,959

[22] Filed: Jun. 12, 1998

[51] Int. Cl.$^6$ .............................. B41C 1/10; G03B 27/04
[52] U.S. Cl. ...................... 101/463.1; 11/467; 355/89; 355/103; 355/108
[58] Field of Search ................... 101/463.1, 465, 101/466, 467, 401.1; 355/85, 89, 103, 108; 430/302, 303, 309

[56] References Cited

U.S. PATENT DOCUMENTS

| | | | |
|---|---|---|---|
| 3,580,670 | 5/1971 | Bhagat | 355/23 |
| 3,749,490 | 7/1973 | Ritzerfeld | 355/89 |
| 3,904,188 | 9/1975 | Fairbanks et al. | 271/3.22 |
| 3,936,171 | 2/1976 | Brooke | 355/23 |
| 4,038,077 | 7/1977 | Land | 101/463.1 |
| 4,092,925 | 6/1978 | Fromson | 101/401.1 |
| 4,131,518 | 12/1978 | Fromson | 205/324 |
| 4,423,955 | 1/1984 | Powers | 355/85 |
| 5,270,839 | 12/1993 | Parulski et al. | 358/474 |
| 5,345,870 | 9/1994 | Bailey et al. | 355/85 |
| 5,369,468 | 11/1994 | Powers et al. | 355/85 |
| 5,455,668 | 10/1995 | De Bock et al. | 399/299 |
| 5,826,513 | 10/1998 | Fromson et al. | 101/463.1 |
| 5,865,118 | 2/1999 | Fromson et al. | 101/463.1 |
| 5,875,023 | 2/1999 | Burke et al. | 355/89 |

*Primary Examiner*—Stephen R. Funk
*Attorney, Agent, or Firm*—Alix, Yale & Ristas, LLP

[57] ABSTRACT

A series of printing plate imagers for imaging lithographic printing plates onto a continuous web are combined in a single imaging process line. The imageable web is passed through a series of properly spaced imaging stations in the line with multiple plate sections being selectively imaged in one or another of the stations or with each individual plate section being partially imaged in two or more stations. The imaging stations may operate in different modes, such as the digital mode with a laser and the analog mode with actinic radiation, with the prepared web capable of being imaged by either of the modes.

13 Claims, 3 Drawing Sheets

METHOD AND APPARATUS FOR THE MULTIPLE IMAGING OF A CONTINUOUS WEB

BACKGROUND OF THE INVENTION

The present invention relates to a process for imaging a continuous web of printing plate stock in a single web processing line having a plurality of imaging stations. In the preferred embodiment, the web is prepared to be imageable by either of two or more separate imaging modes. The process employs a continuous web imaging line having at least two imaging stations in the line, one station operating in a first imaging mode and the other preferably operating in a second imaging mode. Specifically, the invention relates to lithographic printing plates.

Conventional lithographic printing plates, such as those typically used by both newspaper and commercial printers, are usually made of a grained, anodized aluminum substrate which has been coated with a light sensitive coating. The anodized aluminum is generally post treated to enhance the hydrophilicity of the anodized substrate sheet prior to the application of the light sensitive coating.

Graining of the aluminum is commonly accomplished in a variety of ways including mechanical brush graining, chemical graining and electrochemical graining. The grained surface has better adhesion to the light sensitive coating and carries fountain solution in the background areas of the plate on the press more efficiently than an ungrained surface. Anodizing is the process of electrolytically generating aluminum oxide on the surface of an aluminum sheet. Since the anodic aluminum oxide is harder and more abrasion resistant than the aluminum, an anodized printing plate has a greater press life than a bare plate.

Conventional lithographic printing plates with a positive working light sensitive coating are imaged with actinic radiation, such as ultra violet light, through a photographic positive to solubilize the light sensitive coating in the non-image areas. The plate is then developed with a solvent for the solubilized coating. With such positive working plates, the coating remains in the areas which have not been exposed to the light and it is these areas which are oleophilic and comprise the image to be printed.

Lithographic printing plates are also available which are imageable by the use of infrared lasers. For example, U.S. Pat. No. 4,731,317 to Fromson et al., discloses a printing plate based on a substrate which is brush grained in a slurry comprising alumina followed by successive treatments in dilute sodium hydroxide and nitric acid, and subsequent anodizing to achieve an oxide coating weight of 1.5 milligrams per square inch. The substrate may also be silicated after anodizing to improve hydrophilicity. The anodized plate is coated with a diazo resin which is transparent to the radiation of a YAG infrared laser (1064 nanometers), but is sensitive to the longer wavelengths generated within the areas of the anodic oxide exposed to the laser. In this case, the plate is negative working since the diazo is rendered insoluble where the plate is exposed to the laser. Following laser exposure, the unexposed diazo is removed with a solvent to reveal the hydrophilic oxide.

Several options are available for forming an image on a lithographic plate. Digital imaging by a computer controlled laser is a relatively new technology that eliminates the need for imaging and processing film. The digital imaging can take place as a result of selective ablation, curing or photolytic alteration of the solubility of the coating. At the present time, the cost of digital plates is typically higher than for conventional analog type plates. Another alternative imaging technique involves the use of electrostatic ink jet deposition technology. There are again several approaches. One can ink jet an oleophilic material directly onto a hydrophilic substrate. An ink jet material can be coated onto a photosensitive coating and serve as a photomask for actinic exposure in either a positive or negative mode. U.S. Pat. No. 5,750,314 to Fromson et al discloses an insoluble ink jet coating selectively applied over a soluble lithographic coating which need not be photosensitive. The insoluble ink jet mask prevents the soluble coating from being removed by the solvent. Each of these imaging techniques has a particular advantage. It would, therefore, be desirable to have different types of imagers available without consuming excess space in the printing plant.

Another factor in the conventional production of lithographic printing plates is that the typical process involves the handling of a stock of individual sensitized plates with all of the required handling time and equipment. Each plate must be loaded into an imager, imaged and then unloaded. Imaging the printing plates in a continuous process line on a web including accurate registration and cutting the imaged plates from the web to form the individual plates would greatly simplify the process. Therefore, such imaging on a continuous web is the subject matter of the copending U.S. patent applications Ser. No. 09/041,615 of Fromson et al. filed Mar. 12, 1998, now U.S. Pat. No. 5,865,118 and 08/955,041 of Fromson et al. filed Oct. 21, 1997 now U.S. Pat. No. 5,826,513.

SUMMARY OF THE INVENTION

An object of the present invention is to combine a series of printing plate imagers for imaging lithographic printing plates on a continuous web in a single lithographic printing plate imaging process line. The process preferably combines two or more different imaging modes.

According to the invention, a continuous web of lithographic printing plate stock is prepared which is capable of being imaged. The invention involves passing the prepared web through a series of imaging stations in a single processing line with the multiple plate sections on the web being selectively imaged in one or another of the imaging stations or with each individual plate section being partially imaged in two or more of the imaging stations. In the preferred embodiment, the imaging stations operate in different modes to produce the images. More particularly, the web is prepared with a coating which is capable of being imaged by either of two or more separate imaging modes. Most particularly, one is a laser imager operating in a digital mode and the other is an actinic imager operating in an analog mode. The imaging stations are spaced from each other along the processing line a distance appropriate to image the proper plate sections and to obtain proper registration as the web is advanced. Punching means may be included for purposes of registration both in the imaging process line and on the press. Cutting means are also provided and properly positioned to cut the individually imaged plates from the web.

DESCRIPTION OF THE PREFERRED EMBODIMENTS

According to the present invention, a web of lithographic printing plate substrate material, which is preferably roughened and anodized and otherwise prepared to accept an image, is passed along an imaging process line containing two or even more separate imagers adapted to image selected printing plate areas of the web simultaneously. In the preferred embodiment to be described, the web is coated with a material which is capable of reacting to either of two different imaging modes to form images on the web such that the images, when appropriately developed, will function in the manner of a lithographic printing plate. Specifically, the preferred modes of imaging according to the present invention are digital such as by laser radiation and analog such as by actinic radiation. Because the continuous web is prepared to react to either of the radiation modes, one imaging process line including the different imaging modes each capable of handling web imaging can be employed. The use of the single imaging process line affords the versatility of selecting the appropriate imaging mode for each individual plate or for individual portions of plates. Furthermore, the inclusion of the two imagers in one process line means that only one web feeding system, only one web punching station and only one cutting station are required. Additionally, in the event of a breakdown of one imaging station, the web can still be imaged in the working imaging station.

The lithographic printing plate substrate of the present invention is preferably a web of aluminum which is a conventional lithographic printing plate substrate. However, other substrates can be used such as polyester sheets or laminates of metal and plastic. The substrate web is typically aluminum which has been grained and anodized prior to the application of the coating. As is known, graining is the process of roughening the surface of the aluminum by one of the graining techniques such as chemical graining and electrochemical graining. The preferred graining process of the present invention is mechanical brush graining in a slurry comprising alumina as known in the art. For example, see U.S. Pat. No. 4,183,788 to Fromson et al. Also, although not required, the aluminum substrate web is anodized which is typical in the lithographic printing plate art. For example, see U.S. Pat. Re 29,754 to Fromson.

Figure 1:
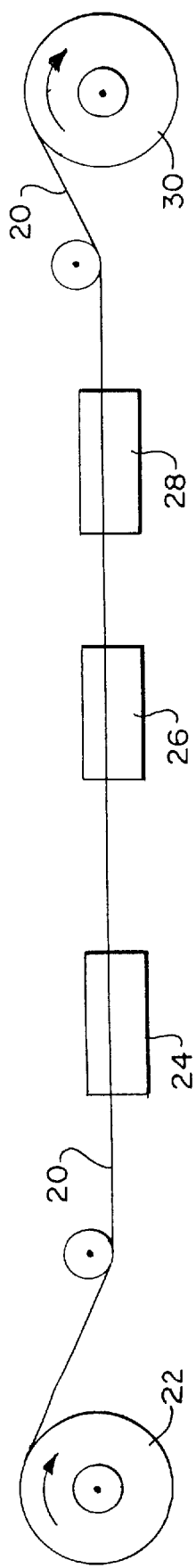
FIG. 1 is a block process flow diagram illustrating the process for graining, anodizing and coating a continuous web for use in the invention.

FIG. 1 of the drawings depicts the process steps of preparing a web 20 of lithographic printing plate substrate material from the roll 22. The web is first brush grained at 24 and then preferably anodized at 26 according to prior art techniques. The grained and anodized web is then coated at 28 also according to prior art printing plate coating techniques with a coating material as required by certain embodiments of the present invention. The grained, anodized and coated web is then rolled at 30 as lithographic printing plate stock in web form ready for imaging according to the present invention.

Figure 2:
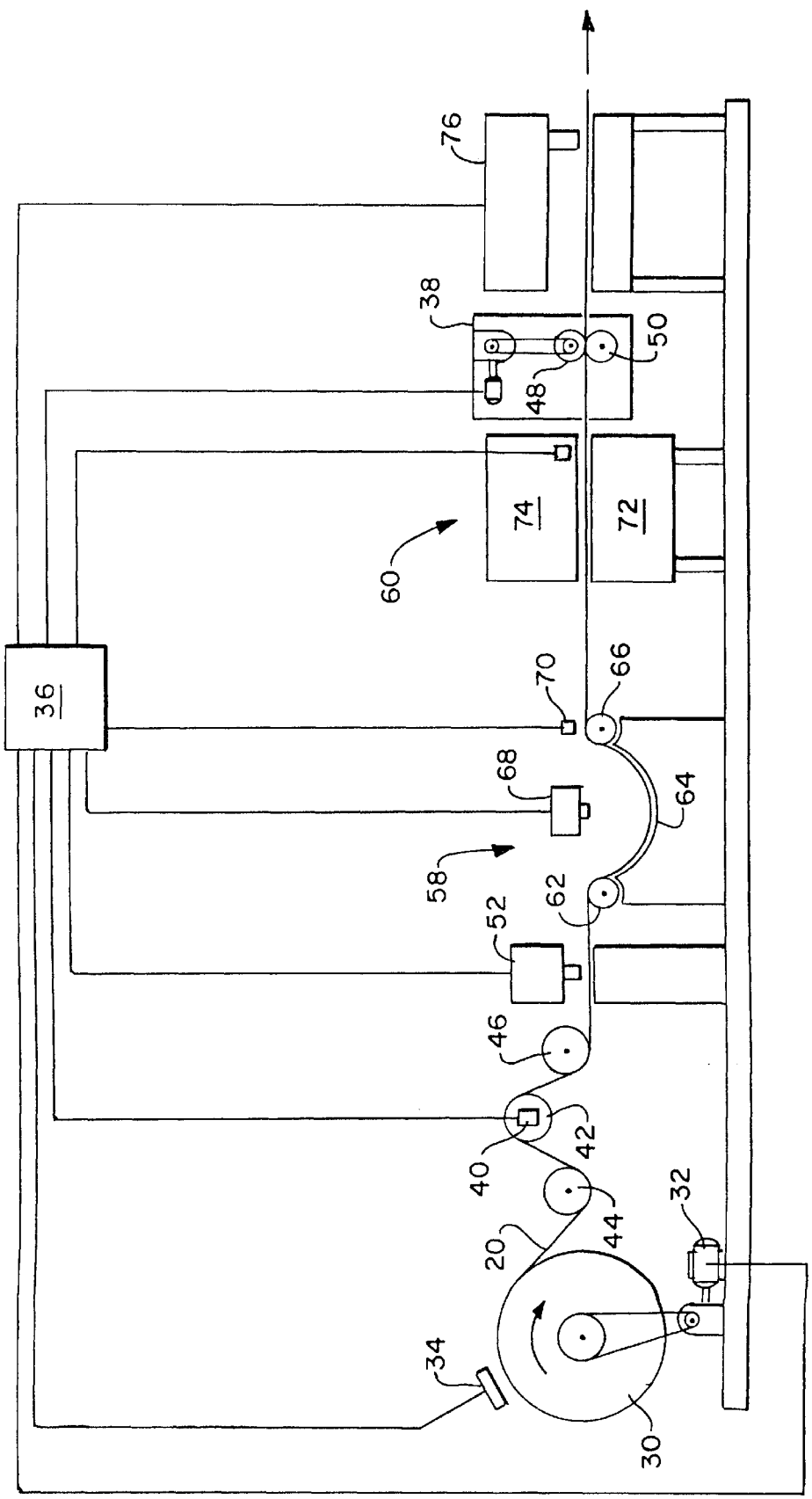
FIG. 2 is a process flow diagram illustrating the punching, imaging and cutting steps of the present invention for the web produced in the process according to FIG. 1.

The present invention relates to the imaging of printing plates on the web 20 which now has an imageable surface. FIG. 2 illustrates the web of imageable printing plate stock 20 coming off the unwind reel 30. The unwind reel 30 is driven by a controlled power source such as motor 32 with regenerative capabilities as known in the art. Such a device is capable of operating in reverse or of applying negative torque. A diameter sensing device 34 is used to provide a signal to the control system 36 representing the current diameter of the web on the unwind reel. Any suitably accurate distance-measuring device can be used. This diameter is required by the control system to accurately calculate the proper revolutions per minute of the unwind reel and thus control the speed of the motor 32 to set the proper web speed. The control system 36 is merely a conventional type of timing sequencing and calculating device to control the various functions of the entire process as discussed later.

Web tension is created by the pull roll system 38 providing a forward pull on the web and the unwind reel 30 providing the back tension through the motor 32. Web tension is sensed by a linear variable-differential transformer (LVDT) transducer or a strain gauge or similar known tension sensing device 40 associated with the roll 42. For example, the pillow blocks for the journals of the roll 42 can be mounted on the transducers which will then produce a signal proportioned to the force of the web on the roll 42 and thus proportional to the web tension. Rolls 44 and 46 maintain a constant angle of wrap of the web around the roll 42. The tension feedback signal from 40 is utilized by control system 36 to determine the proper control parameters of speed and torque for motor 32 thereby insuring that the proper web tension is maintained.

The primary control of the registration in the process line is the pull roll system 38. The pull roll system 38 consists of two feed rolls 48 and 50 that are ground to a precisely controlled diameter. The feed rolls 48 and 50 are conventional intermittently driven types of feed rolls which engage the web and intermittently move the web forward a predetermined distance equivalent to the size of one printing plate as set into the control system 36.

Figure 3:
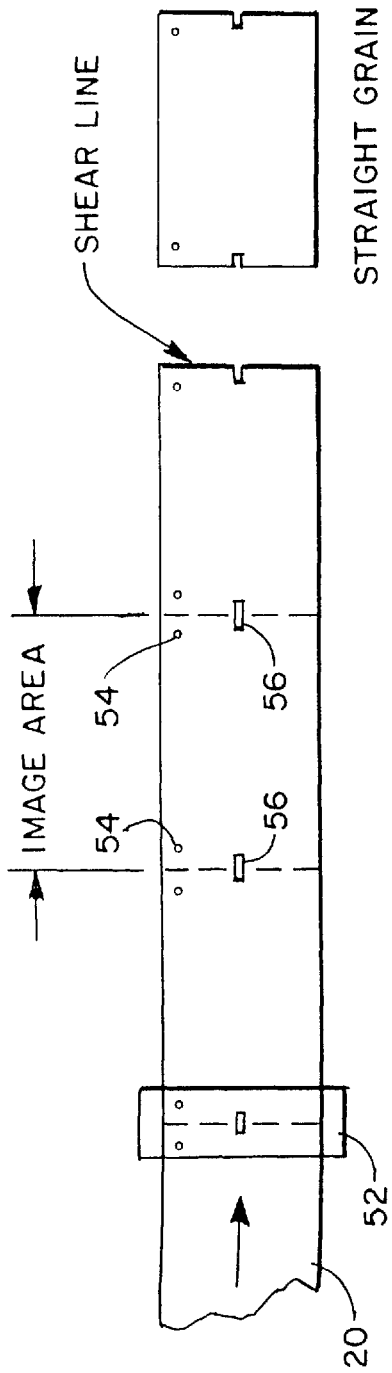
FIG. 3 is a top view of straight grain punched web according to the invention.
Figure 4:
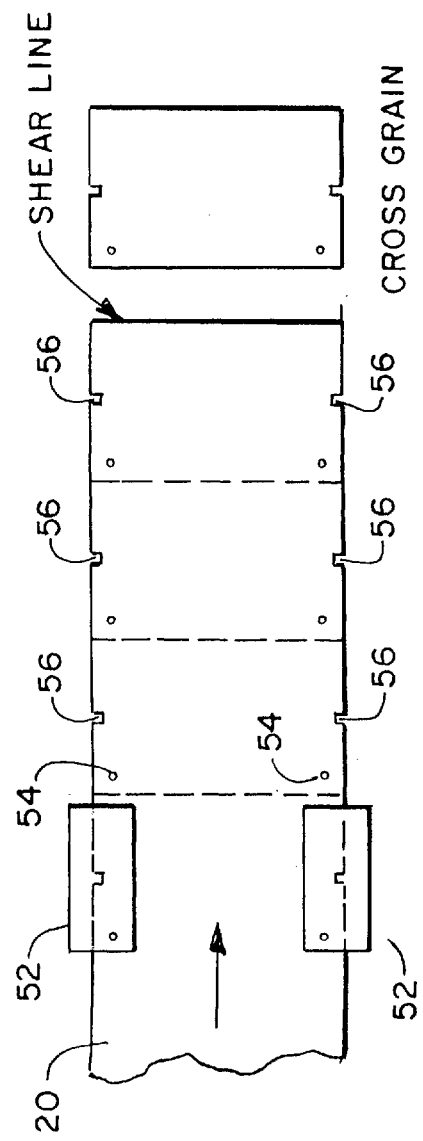
FIG. 4 is another top view of a punched web showing a cross grain form of punching.

Following the roll 46 is a punching mechanism 52 as known in the art for punching registration apertures in the web. Examples are the holes 54 and notches 56 as shown in FIGS. 3 and 4. These holes and notches may be of any desired configuration and they may be straight grain punches as shown in FIG. 3 (across the web) or cross grain punches as shown in FIG. 4 (lengthwise along the edges of the web). The notches 56 are representative of the apertures required for registration on the printing press while the holes 54 are typically used for registration in the equipment for forming the bend in the ends of the plates for mounting on the press cylinder. Since the registration notches and the bending holes, if required for bending, are pre-registered to the imaging system, the invention provides a very accurate registration system on press. Although the punching mechanism 52 has been shown as a relatively small device extending along the path of the web a short distance, it would probably be larger in actual practice to simultaneously punch a plurality of plates since the web may be advanced a plurality of plate-lengths at a time.

From the punching mechanism 52, the punched web is fed to the two imaging stations generally designated 58 and 60. FIG. 2, for example purposes only, depicts the imaging station 58 as being an internal drum type imager with an arcuate platen and the imaging station 60 as being a flat platen imager, both of the imagers being adapted to image on a continuous web. However, the internal drum type imager and the flat platen imager could be reversed or both imaging stations could employ imagers having the same structure.

The internal drum type imager 58 may be any such imager designed to handle and image on a continuous web. Such an imager is described in detail and claimed in U.S. patent application Ser. No. 09/041,615 of Fromson et al. filed Mar. 12, 1998 now U.S. Pat. No. 5,865,118. As shown in FIG. 2, this imager comprises an entrance roll 62, arcuate concave imaging platen 64, exit roll 66, and an imaging head 68. The rolls 62 and 66 are of conventional design utilizing a steel core covered with a non-marking material such as a rubber compound. The arcuate concave imaging platen 64 has a series of pin holes (not shown) that are formed in the surface of the platen which connect to a vacuum chamber and a vacuum pump (also not shown) for holding the web tight to the arcuate platen 64.

The web 20 passes into the imaging chamber during an indexing cycle and is stopped at the proper position by the position sensor 70, such as an optical sensor, which detects an appropriate punched hole 54. This can then provide for the indexing of the web to each successive position. The sensor 70 is ideally located at or close to the imaging station 58 to ensure the highest degree of accuracy in the imaging process. The control signal generated by the sensor 70 is used by the control system 36 to identify the web stopping position and stop the feed rolls to ensure the accurate position of the punched holes 56 in the imaging station 58. As a variation, the sensor can determine the actual position of the press registration apertures 56 and transmit that position to the control system 36. The control system then calculates the difference between the actual position of the apertures and the preset theoretical position. The calculated difference generates a datum line offset that is used by the control system to initiate the starting point for the laser imaging system in a known manner.

Upon completion of the indexing cycle, the leading end of the web 20 is held in a fixed position by the feed rollers 48 and 50 and the web 20 is pulled from the supply reel 30 and forced into contact with the platen 64. The details of this process and the apparatus are disclosed in the previously mentioned U.S. patent application Ser. No. 09/041,615, now U.S. Pat. No. 5,865,118. As the web comes in contact with the platen, the vacuum is activated to secure the web in position on the platen. The web is now in position and is imaged with the imager 68 which is suitable for imaging on a concave platen.

The imaging station generally designated 60 comprises a flat platen 72 and an imager 74. Such a flat platen imager for imaging on a web is described in detail and claimed in U.S. patent application Ser. No. 08/955,041 of Fromson et al. filed Oct. 21, 1997, now U.S. Pat. No. 5,826,513. The punched web 20 which has been fed onto the platen 72 is imaged by the imaging device 74.

Figure 5:
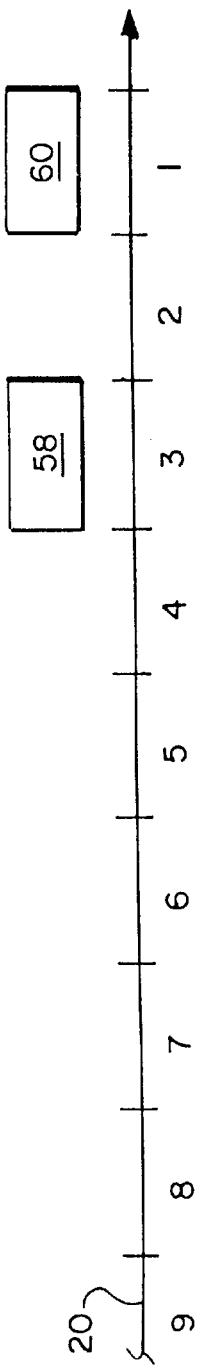
FIG. 5 is a diagrammatic illustration of the imagers and printing plate sections of the web.

Upon completion of the imaging in the stations 58 and 60, the controller 36 again triggers the web to move forward the required amount ready for the next imaging step. For the first embodiment of the present invention where the imager 68 in station 58 and imager 74 in station 60 are each fully imaging an individual printing plate section, the sequence for imaging and for the web movement is as follows read in conjunction with FIG. 5 in which the imaging stations 58 and 60 are spaced apart exactly one plate length:

a. Image plate section 1 at station 60 and plate section 3 at station 58;
b. Move web one plate length;
c. Image plate section 2 at station 60 and plate section 4 at station 58;
d. Move web three plate lengths;
e. Image plate section 5 at station 60 and plate section 7 at station 58;
f. Move web one plate length;
g. Image plate section 6 at station 60 and plate section 8 at station 58;
h. etc.

By this process, two printing plates are simultaneously imaged and the web movement provides for imaging every plate section of the web in proper registration. If there were to be more than two imaging stations simultaneously imaging, a similar procedure would be followed. The logic sequence for advancing the web where the length of one plate equals L, the distance between imagers equals N×L where N is an integer and the number of imaging stations equals S is as follows:

N increments of advancement of distance L
One increment of advancement at a distance of [S×L]+[(S−1)×N×L]

In the preferred embodiment of the present invention, the imaging of the printing plates at the several imaging stations is multimodal, i.e., a different imaging mode is used at each of the imaging stations. For example, the imaging modes may be selected from, but not necessarily limited to, combinations of the following:

1. Laser imaging in the positive mode to remove (ablate) the coating in the background area leaving the coating in the image areas. The coating is then developed to form the oleophilic areas.
2. Laser imaging in the negative mode to cure a negative working coating in the image area with subsequent removal of the still soluble coating in the background.
3. Actinic radiation imaging in the positive mode to solubilize the coating in the background area leaving an insoluble coating in the image areas to be developed.
4. Actinic radiation imaging in the negative mode to cure the coating in the image area.
5. Jet imaging to apply a photomask in selected areas of a positive working plate while other areas are masked with a photographic positive.
6. Jet imaging to apply an oleophilic composition in an image area.
7. Jet imaging an insoluble coating in an imagewise pattern on top of a soluble lithographic coating such that the insoluble ink jet coating prevents the soluble coating from being removed by the solvent.

The coating material which is applied to the web at 28 in accordance with the embodiment of the present invention using multimodal imaging is a coating which is capable of responding to each mode of radiation to produce an imaged lithographic printing plate. In the most preferred embodiment, this coating is a positive acting coating which means that the coating in the areas which are exposed to the radiation, such as laser or actinic radiation, is removed and the coating in the unexposed areas remains. The exposed area where the coating is removed becomes the hydrophilic background area while the unexposed area becomes the oleophilic image area. Suitable coatings of this type are known in the art and comprise materials such as phenolic resins and resol resins. An example of a positive acting coating which is both photosensitive and removable (ablatable) by laser radiation is as follows:

| | |
|---|---|
| Acrosolve PM (glycol ether solvent) | 42.86% |
| Ethanol (solvent) | 21.34% |
| 1,1-Napthoquinone diazide [2]-5-sulfonyloxy | 9.26% |

-continued

| | |
|---|---|
| P-cresol resin | |
| Cresol resin | 10.70% |
| t-Butylphenolformaldehyde resin | 0.36% |
| Phenolformaldehyde resin | 4.76% |

The above coating was applied to a grained and anodized aluminum substrate at a dry coating weight of 140 mg/sq ft. The thus prepared plate was imaged on a Gerber Crescent 42T Plate Image Setter at a laser power of 6.5 watts. The coating was ablated in the areas where the laser had imaged the plate. The plate was developed with a commercially available Fuji DP-4 developer at a dilution of 1 part developer to 8 parts water. After development, the areas of the plate which had been imaged by the laser were free of coating, while the non-laser laser written areas of the plate retained the coating. The retained coating can then be imaged by actinic (ultraviolet) light.

Referring back now to the imagers, although imaging by actinic radiation through a negative on an internal drum is possible, imaging on an internal drum is most likely done by laser radiation. Therefore, the imager 68 is usually a conventional laser imager for internal drum imaging. Since the imager 68 is of the laser type (digital) and since the invention employs two different imaging modes, the imager 74 is an actinic radiation (analog) imager. Although the laser imager has been shown in FIG. 2 to be first in the process line, the imagers can be reversed in order. Also, the laser imaging can just as well be done with a flat platen imager as with the internal drum imager as shown. Furthermore, when the laser imaging is first to be followed by the actinic imaging in the same plate area, it is necessary to mask the already laser imaged areas from the actinic radiation in order to preserve the laser image. This can be done by the photographic negative which is used in the actinic imager.

For registration purposes, the two imaging stations 58 and 60 are spaced apart along the web in the processing line a distance exactly equal to one printing plate length or a multiple of the exact length as previously discussed. Also, the punching mechanism is spaced from the first imager a distance equal to one plate length or a multiple thereof. In that way, the punching and indexing of the web will position the web and each individual plate on the web in the proper position in the imagers. The same is also true for the plate cutters to be described below.

The present invention can be employed for imaging the web in two different situations. One situation is where the first imager images a first plate and the second imager simultaneously images a second plate. The other situation is where the first imager images a portion of a plate and then the second imager images the other portion of that same plate. These two situations require different web movements. If one plate is fully imaged at station 58 and simultaneously another plate is fully imaged at station 60 and with one plate length between stations, the web movement alternates between advancing one plate length and advancing three plate lengths. If each plate is partially imaged at station 58 and then the remaining portion of each plate is imaged at station 60 (while another plate is being imaged at station 58), the web is consistently moved one plate length.

Once imaged, the control system 36 causes the web to move forward to the next position and the process is repeated. Following the pull roll system 38 is a shear device 76 which cuts the web into individual plates. The shear device 76 is also controlled by the controller 36 and is preferably located a distance from the imager 60 that is an exact multiple of the plate length since the accuracy of the shear cut-off length is determined by this distance. After cutting, the plates can be sent to developing, washing and bending stations which are not shown.

There are a number of advantages of the present invention over the prior art. First of all, since there are imagers operating in two different modes in the same continuous web processing line, the imaging mode can be readily selected for each individual plate or discrete portions of each individual plate. The punching, imaging and cutting are performed as a continuous operation instead of as individual, discrete processing steps. This eliminates the time and equipment for the handling of individual plates between each step. The time for imaging is reduced over the prior art since the web to be imaged can be fed into the imager as the already imaged region is being removed.

An additional advantage lies in the fact that the punching, imaging and cutting are done in a way so as to assure alignment and registration with much greater precision than the prior art. By punching and then indexing the process for the imaging and sheeting (cutting) operations from the punched holes, the finished plates can be prepared with a greatly improved registration when mounted on a press, resulting in a reduction of losses on start-up of the press. This alleviates the need for the costly and time consuming optical bending as is currently often used in the printing industry for registration.

We claim:

1. A process for preparing and imaging a continuous web of printing plate stock comprising the steps of:
   a. mechanically roughening an aluminum substrate web to form a roughened surface;
   b. coating said mechanically roughened aluminum substrate web with a material which:
      i. is ablatable from said surface where the surface is struck by said infrared laser radiation, and
      ii. is a positive-acting coating sensitive to and selectively imageable by actinic radiation;
   c. passing a first section of said coated, roughened continuous web into a first imaging station including laser imaging means and laser imaging a first portion of said first section;
   d. passing said laser imaged first section of said web from said first imaging station into a second imaging station including actinic radiation imaging means and actinically imaging a second portion of said first section; and
   e. passing said laser radiation and actinic radiation imaged first section of said web from said second imaging station and cutting said imaged first section from said web thereby forming a discrete imaged printing plate.

2. A process as recited in claim 1 and further including the step of anodizing said roughened surface of said aluminum substrate web prior to coating.

3. A process as recited in claim 1 wherein said coating is a positive acting coating based on phenolic resins.

4. A process for preparing and imaging a continuous web of printing plate stock comprising the steps of:
   a. mechanically roughening an aluminum substrate web to form a roughened surface;
   b. coating said mechanically roughened aluminum substrate web with a material which:
      i. is ablatable from said surface where the surface is struck by infrared laser radiation, and
      ii. is a positive-acting coating sensitive to and selectively imageable by actinic radiation;
   c. providing a first imaging station including first imaging means and a second imaging station including second imaging means, one of said first and second imaging means being a laser radiation imaging means and the other of said first and second imaging means being actinic radiation imaging means;

d. passing a first section of said coated, roughened continuous web into said first imaging station and imaging a first portion of said first section;

e. passing said imaged first section of said web from said first imaging station into said second imaging station and imaging a second portion of said first section; and f. passing said laser radiation and actinic radiation imaged first section of said web from said second imaging station and cutting said imaged first section from said web thereby forming a discrete imaged printing plate.

5. A process for preparing and imaging a continuous metal substrate web comprising the steps of:

a. preparing a metal substrate web whereby said prepared web is imageable both by a first imaging mode and a second imaging mode different from said first imaging mode;

b. providing a first imaging station including first imaging means operable in said first imaging mode and a second imaging station including second imaging means operable in said second imaging mode;

c. advancing said prepared web to pass a first section of said prepared web into said first imaging station and imaging a first portion of said first section by said first imaging means;

d. advancing said prepared web to pass said imaged first section of said prepared web from said first imaging station into said second imaging station and to pass a second section of said prepared web into said first imaging station;

e. imaging a second portion of said first section in said second imaging station and a first portion of said second section in said first imaging station;

f. repeating steps d. and e. for subsequent sections of said prepared web; and g. cutting said imaged sections into discrete imaged printing plates.

6. A process as recited in claim 5, wherein said step of preparing said metal substrate web comprises the steps of:

a. mechanically roughening said metal substrate web to form a roughened surface; and b. coating said mechanically roughened metal substrate web with a material which:
i. is ablatable from said surface where the surface is struck by infrared laser radiation; and
ii. is a positive-acting coating sensitive to and selectively imageable by actinic radiation.

7. A process as recited in claim 6, wherein said first imaging means includes laser radiation imaging means and said second imaging means includes actinic radiation imaging means.

8. A process as recited in claim 6, wherein said first imaging means includes actinic radiation imaging means and said second imaging means includes laser radiation imaging means.

9. A process for preparing and imaging a surface of a continuous substrate web comprising the steps of:

a. preparing said surface of said substrate web whereby said surface of said prepared web is imageable both by a first imaging mode and a second imaging mode different from said first imaging mode;

b. providing a first imaging station including first imaging means operable in said first imaging mode and a second imaging station including second imaging means operable in said second imaging mode;

c. imaging selected sections of said surface of said prepared web in said first imaging station during a first period of time; and d. imaging other selected sections of said surface of said prepared web in said second imaging section during a second period of time.

10. A process for preparing an imageable continuous substrate web and imaging printing plate sections on said web wherein said printing plate sections are of a selected dimension in the direction of the web comprising the steps of:

a. preparing a substrate web whereby said prepared web is imageable;

b. providing a first, imaging station including a first imaging means and a second imaging station including a second imaging means, said first and second imaging stations being spaced apart said selected dimensions or a multiple thereof;

c. advancing said prepared web into both said first and second imaging stations;

d. imaging a first printing plate section in said first imaging station and a second printing plate section in said second imaging station;

e. advancing said prepared web containing said imaged first and second printing plate sections a distance equal to said selected dimension;

f. imaging a third printing plate section in said first imaging station and a fourth printing plate section in said second imaging station;

g. advancing said prepared web containing said first, second, third and fourth printing plate sections a distance equal to three times said selected dimension; and h. repeating steps d to g.

11. A process as recited in claim 10 wherein said first and second imaging means are operable in the same imaging mode.

12. A process as recited in claim 10 wherein said first imaging means is operable in a first imaging mode and said second imaging means is operable in a second imaging mode different from said first imaging mode.

13. A process as recited in claim 12 wherein one of said first and second imaging modes are selected from laser radiation, actinic radiation and electrostatic jet deposition.

* * * * *

UNITED STATES PATENT AND TRADEMARK OFFICE
CERTIFICATE OF CORRECTION

PATENT NO : 5,967,048
DATED : October 19, 1999
INVENTOR(S) : Fromson et al

It is certified that error appears in the above-identified patent and that said Letters Patent are hereby corrected as shown below:

Claim 1, column 8, line 36, delete "said".

Claim 5, column 9, lines 20 and 21, delete "imagining" and insert --imaging--.

Claim 10, column 10, line 26, after "first" delete ",".

Signed and Sealed this

Twenty-second Day of May, 2001

Attest:

NICHOLAS P. GODICI

Attesting Officer      Acting Director of the United States Patent and Trademark Office